(12) United States Patent
Kwon et al.

(10) Patent No.: US 10,620,529 B2
(45) Date of Patent: Apr. 14, 2020

(54) PHOTOMASKS

(71) Applicant: Samsung Electronics Co., Ltd., Suwon-si, Gyeonggi-do (KR)

(72) Inventors: Sungwon Kwon, Suwon-si (KR); Yongkyu Kim, Asan-si (KR); Jinsu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 15/602,302

(22) Filed: May 23, 2017

(65) Prior Publication Data
US 2018/0067390 A1    Mar. 8, 2018

(30) Foreign Application Priority Data

Sep. 6, 2016    (KR) .................. 10-2016-0114504

(51) Int. Cl.
    *G03F 1/24*      (2012.01)
    *G03F 1/48*      (2012.01)
    *G03F 1/38*      (2012.01)
    *G03F 1/36*      (2012.01)
    *G03F 1/54*      (2012.01)
    *G03F 1/52*      (2012.01)
    *G03F 1/60*      (2012.01)

(52) U.S. Cl.
CPC .................. *G03F 1/38* (2013.01); *G03F 1/24* (2013.01); *G03F 1/52* (2013.01); *G03F 1/54* (2013.01); *G03F 1/60* (2013.01)

(58) Field of Classification Search
CPC ...................................... G03F 1/42; G03F 1/48
See application file for complete search history.

(56) References Cited

U.S. PATENT DOCUMENTS

| | | | | |
|---|---|---|---|---|
| 5,538,817 A | * | 7/1996 | Smith .................. | B23K 26/066 |
| | | | | 216/41 |
| 5,723,234 A | * | 3/1998 | Yokoyama ................ | G03F 1/26 |
| | | | | 430/312 |
| 7,282,307 B2 | | 10/2007 | Hector et al. | |

(Continued)

FOREIGN PATENT DOCUMENTS

| | | | | |
|---|---|---|---|---|
| EP | 2905637 A1 | | 8/2015 | |
| JP | 62-221111 | * | 9/1987 | ........... H04L 21/265 |

(Continued)

OTHER PUBLICATIONS

S.A. Steward, "Review of Hydrogen Isotope Permeability Through Materials" Lawrence Livermore National Laboratory, Aug. 15, 1983.

*Primary Examiner* — Martin J Angebranndt
(74) *Attorney, Agent, or Firm* — Harness, Dickey & Pierce, P.L.C.

(57) ABSTRACT

Disclosed is a photomask. The photomask comprises a substrate, a reflective layer on the substrate, and an absorption structure on the reflective layer. The absorption structure comprises absorption patterns spaced apart from each other on the reflective layer. The absorption structure may include dummy holes in at least one of the absorption patterns. The dummy holes exhaust hydrogen from the absorption structure. The photomask may include a barrier layer on the absorption structure. The barrier layer may reduce the amount of hydrogen entering the absorption structure.

9 Claims, 6 Drawing Sheets

(56) References Cited

U.S. PATENT DOCUMENTS

| | | |
|---|---|---|
| 8,029,950 B2 | 10/2011 | Hayashi et al. |
| 8,241,821 B2 | 8/2012 | Ikuta |
| 8,628,897 B1* | 1/2014 | Lu .................... G03F 1/24 430/5 |
| 8,962,224 B2 | 2/2015 | Wu et al. |
| 9,239,515 B2 | 1/2016 | Hayashi |
| 2003/0232256 A1* | 12/2003 | Wurm .................. B82Y 10/00 430/5 |
| 2005/0208389 A1* | 9/2005 | Ishibashi ............. B82Y 10/00 430/5 |
| 2006/0270226 A1 | 11/2006 | Hosoya |
| 2009/0226825 A1* | 9/2009 | Hagiwara ............ B82Y 10/00 430/5 |
| 2011/0027703 A1* | 2/2011 | Shoki .................. B82Y 10/00 430/5 |
| 2011/0117479 A1* | 5/2011 | Suga .................... B82Y 10/00 430/5 |
| 2012/0141923 A1* | 6/2012 | Deweerd ................ G03F 1/48 430/5 |
| 2013/0029253 A1* | 1/2013 | Mangat .................. G03F 1/22 430/5 |
| 2013/0302724 A1* | 11/2013 | Yang ...................... G03F 1/36 430/5 |
| 2014/0051015 A1* | 2/2014 | Gallagher ............... G03F 1/24 430/5 |
| 2014/0186752 A1* | 7/2014 | Kinoshita ............... G03F 1/24 430/5 |
| 2014/0212794 A1* | 7/2014 | Maeshige ............... G03F 1/24 430/5 |
| 2014/0253887 A1* | 9/2014 | Wu ........................ G03F 1/82 355/30 |
| 2014/0272677 A1* | 9/2014 | Raghunathan ........ G03F 7/2022 430/5 |
| 2014/0272678 A1* | 9/2014 | Shih ...................... G03F 1/24 430/5 |
| 2014/0363633 A1* | 12/2014 | Kim ...................... G03F 1/22 428/195.1 |
| 2015/0037544 A1* | 2/2015 | Lee ....................... G03F 1/52 428/195.1 |
| 2015/0107617 A1* | 4/2015 | Lee ....................... G03F 1/82 134/1 |
| 2015/0370942 A1* | 12/2015 | Lin ..................... G06F 17/5068 716/54 |
| 2016/0011501 A1* | 1/2016 | Huang .................... G03F 1/36 430/5 |
| 2016/0238924 A1* | 8/2016 | Burkhardt ............... G03F 1/24 |
| 2016/0238939 A1* | 8/2016 | Brunner ............... G03F 7/2022 |
| 2017/0176850 A1* | 6/2017 | Chen ...................... G03F 1/22 |

FOREIGN PATENT DOCUMENTS

| | | | | |
|---|---|---|---|---|
| JP | 2001-356468 | * | 12/2001 | ............ G03F 7/20 |
| JP | 2010-0025823 | * | 3/2010 | ........... H01L 21/027 |
| JP | 2010-192503 | * | 9/2010 | ............. G03F 1/08 |
| KR | 2003071194 | * | 9/2003 | ........... H01L 21/027 |

* cited by examiner

PHOTOMASKS

CROSS-REFERENCE TO RELATED APPLICATIONS

This U.S. nonprovisional patent application claims priority under 35 U.S.C § 119 of Korean Patent Application 10-2016-0114504 filed on Sep. 6, 2016 entire contents of which are hereby incorporated by reference.

BACKGROUND

The inventive concepts relates to a photomask, and more particularly, to a photomask having high durability.

In order to satisfy high performance and low cost desired by users, there has been increasingly requested for forming smaller patterns on a semiconductor substrate. To meet these technical requirements, the wavelength of a light source used in a lithography process has become shorter. For example, in the past, the lithography process utilized light having a g-line wavelength band (e.g., 436 nm) or an i-line wavelength band (e.g., 365 nm). Use of light having a deep-ultraviolet, or extreme ultraviolet (EUV) wavelength band is becoming more common. As light having an EUV wavelength band is mostly absorbed by refractive optical materials, an EUV lithography generally utilizes a reflective optical system instead of a refractive optical system.

SUMMARY

Embodiments of the inventive concepts provide a photomask that reduces hydrogen-induced defects.

The inventive concepts, however, are not limited to the embodiments mentioned described herein.

According to example embodiments of the inventive concepts, a photomask may comprise: a substrate; a reflective layer on the substrate; and an absorption structure on the reflective layer. The absorption structure may comprise: absorption patterns spaced apart from each other on the reflective layer; and dummy holes in at least one of the absorption patterns. The dummy holes may exhaust hydrogen from the absorption structure.

According to example embodiments of the inventive concepts, a photomask may comprise: a substrate; a reflective layer on the substrate; an absorption structure on the reflective layer; and a barrier layer on the absorption structure, wherein the barrier layer reduces the amount of hydrogen from entering into the absorption structure.

According to example embodiments of the inventive concepts, a photomask may comprise: a substrate, a capping layer on the substrate, and an absorption structure on the substrate. The absorption structure including absorption patterns spaced apart from one another in a first direction parallel to a top surface of the substrate. The photomask comprises a barrier layer on the absorption structure, wherein the barrier layer is configured to reduce an amount of hydrogen entering into the absorption structure, wherein the barrier layer at least partially covers a top surface and a sidewall of at least one of the absorption patterns, and at least partially covers a top surface of the capping layer.

DETAILED DESCRIPTION OF EMBODIMENTS

Figure 1:
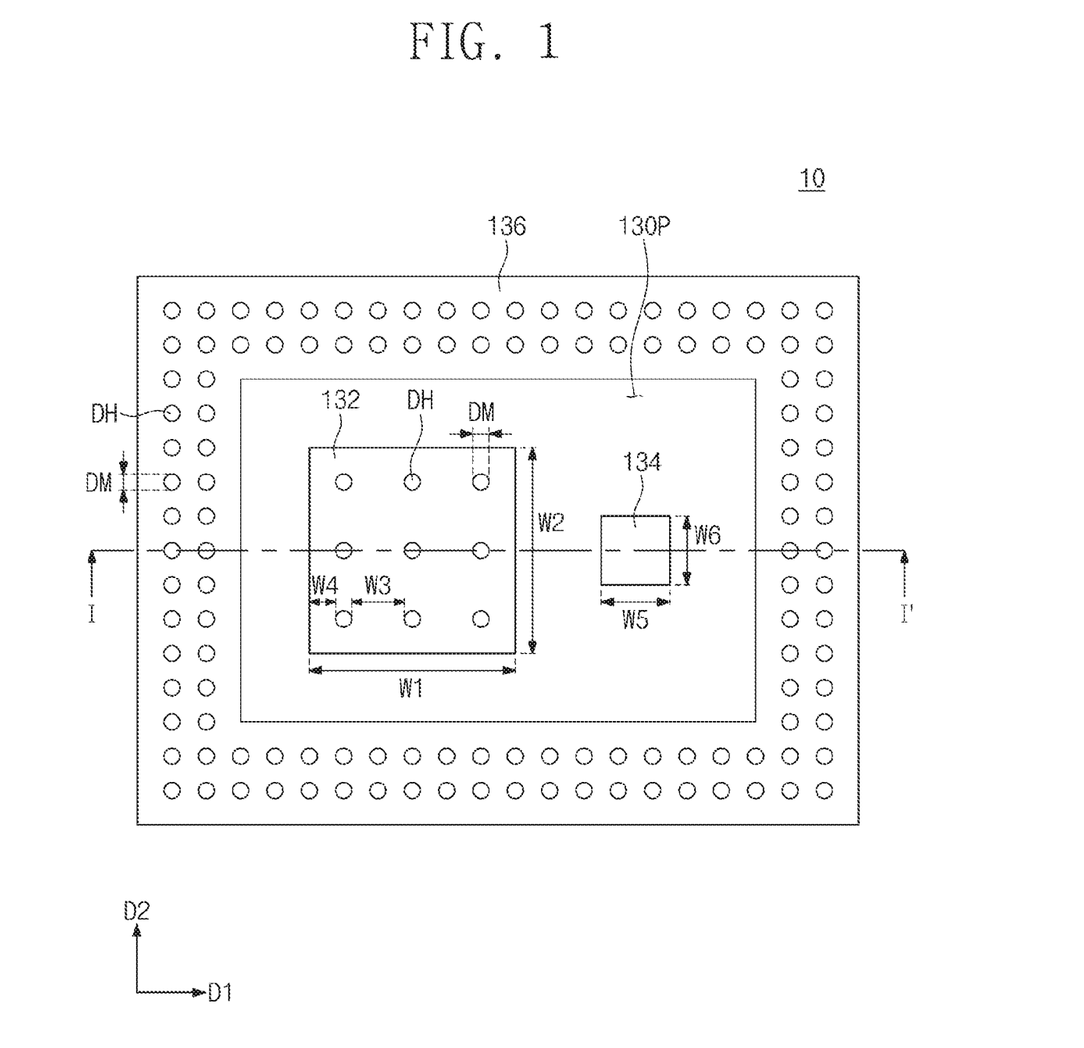
FIG. 1 is a plan view illustrating a photomask according to example embodiments of the inventive concepts.
Figure 2:
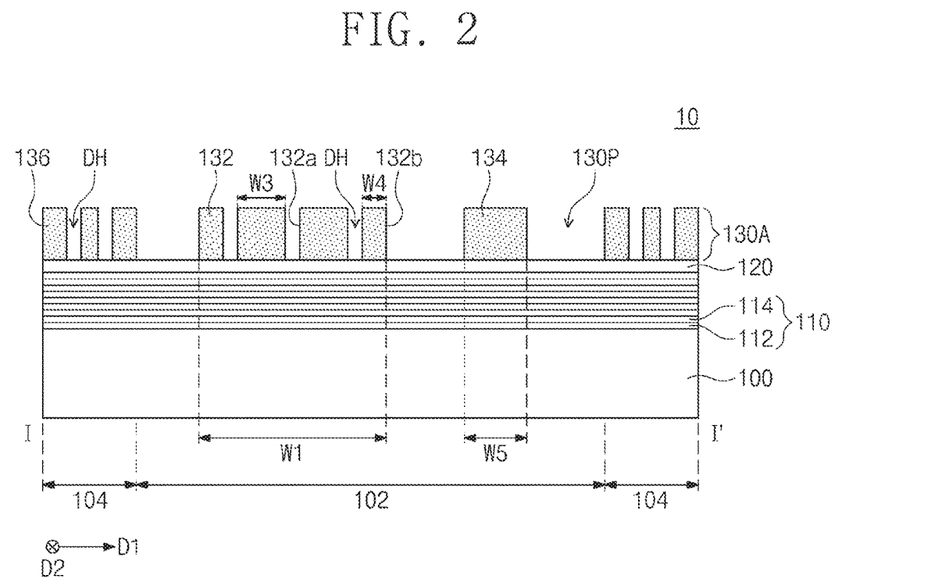
FIG. 2 is a cross-sectional view taken along line I-I' of FIG. 1.

FIG. 1 is a plan view illustrating a photomask according to example embodiments of the inventive concepts. FIG. 2 is a cross-sectional view taken along line I-I' of FIG. 1. For clear description, components are exaggeratingly illustrated.

Referring to FIGS. 1 and 2, a photomask 10 may include a substrate 100. The substrate 100 may include a material having a low thermal expansion coefficient. For example, the substrate 100 may include glass or silicon (Si). The substrate 100 may include a transfer region 102 and a light shield region 104 around the transfer region 102. The transfer region 102 may be a region for transferring a desired pattern onto a semiconductor device.

A reflective layer 110 may be provided on the substrate 100. The reflective layer 110 may reflect incident light (e.g., extreme ultraviolet). The reflective layer 110 may include a Bragg reflector. In some embodiments, the reflective layer 110 may include low refractive index layers 112 and high refractive index layers 114 that are alternately stacked. For example, one high refractive index layer 114 may be provided between a pair of low refractive index layers 112 that are adjacent to each other, or directly adjacent to each other. In contrast, one low refractive index layer 112 may be provided between a pair of high refractive index layers 114 that are adjacent to each other, or directly adjacent to each other. In some embodiments, each of the low and high refractive index layers 112 and 114 may be stacked about 40 to about 60 times. The high refractive index layers 114 may have a refractive index greater than that of the low refractive index layers 112. For example, the low refractive index layer 112 may include molybdenum (Mo), and the high refractive index layer 114 may include silicon (Si). In some embodiments, the low refractive index layer 112 may be disposed at a lowermost position of the reflective layer 110, and the high refractive index layer 114 may be disposed at an uppermost position of the reflective layer 110.

A capping layer 120 may be provided on the reflective layer 110. The capping layer 120 may reduce the likelihood that the reflective layer 110 from damage and surface oxidation. In some embodiments, the capping layer 120 may cover a top surface of the high refractive index layer 114, such as a silicon (Si) layer, and thus the high refractive index layer 114 may be free of oxidation. For example, the capping layer 120 may include ruthenium (Ru). The material included in the capping layer 120 is, however, not limited thereto. The capping layer 120 may be optionally provided. In certain embodiments, no capping layer 120 may be provided.

A first absorption structure 130A may be provided on the capping layer 120. The first absorption structure 130A may include a portion provided on the transfer region 102 of the substrate 100 and a remaining portion provided on the light shield region 104 of the substrate 100. The first absorption structure 130A may include first to third absorption patterns 132, 134, and 136 and an opening 130P through which the capping layer 120 is exposed between the first to third absorption patterns 132, 134, and 136. The first to third absorption patterns 132, 134, and 136 may include a material that adsorbs incident light (e.g., extreme ultraviolet). For example, the first to third absorption patterns 132, 134, and 136 may include TaN, TaHf, TaHfN, TaBSi, TaBSiN, TaB, TaBN, TaSi, TaSiN, TaGe, TaGeN, TaZr, TaZrN, or a combination thereof. The reflective layer 110 may thus not receive extreme ultraviolet incident onto the first to third absorption patterns 132, 134, and 136. Extreme ultraviolet incident onto the capping layer 120 exposed through the opening 130P may penetrate the capping layer 120 to reach the reflective layer 110. A wafer may be irradiated with extreme ultraviolet reflected on the reflective layer 110. A pattern transferred onto the wafer may correspond to a shape of the opening 130P.

The first absorption structure 130A may include the first absorption pattern 132 and the second absorption pattern 134, which are provided on the transfer region 102 of the substrate 100 and spaced apart from each other in a first direction D1 parallel to a top surface of the substrate 100. The first absorption pattern 132 may have a planar size of about 500 µm or more. For example, the first absorption pattern 132 may have a minimum width of about 500 µm or more. The first absorption pattern 132 may have widths, each of which is about 500 µm or more in a direction parallel to the top surface of the substrate 100. For example, as viewed in plan, the first absorption pattern 132 may have an arbitrary shape including therein at least one point that is spaced apart at about 250 µm or more from its most adjacent outer sidewall 132b. The first absorption pattern 132 may have a first width W1 in the first direction D1 and a second width W2 in a second direction D2, which is parallel to the top surface of the substrate 100 and crosses the first direction D1. For example, each of the first and second widths W1 and W2 of the first absorption pattern 132 may be in the range of about 500 µm or more. When the minimum width of the first absorption pattern 132 is in the range of about 500 µm or more, hydrogen may possibly be piled up between the capping layer 120 and the reflective layer 110 or between the first absorption pattern 132 and the reflective layer 110. In this case, the photomask 10 may have a defect where the reflective layer 110 is partially or wholly spaced apart or detached from the capping layer 120 or from the first absorption pattern 132.

Dummy holes DH may be provided in the first absorption pattern 132. For example, the dummy holes DH may penetrate the first absorption pattern 132 in a direction perpendicular to the top surface of the substrate 100, so that a top surface of the capping layer 120 may be exposed through the dummy holes DH. As viewed in plan, each of the dummy holes DH may have a diameter DM less than a minimum line width determined by a resolution limitation of a lithography apparatus using the photomask 10 according to example embodiments of the inventive concepts. Shapes of the dummy holes DH may thus likely not be transferred onto the wafer. For example, the diameter DM of each of the dummy holes DH may be in the range of about 32 nm or less. The inventive concepts are, however, not limited thereto. The diameter DM of the dummy hole DH may be changed in accordance with a lithography apparatus. The dummy holes DH directly adjacent to each other in the first absorption pattern 132 may be spaced apart from each other at a third width W3 in the first direction D1 or in the second direction D2. The third width W3 may be in the range of less than about 500 µm. The opening 130P and its directly adjacent dummy hole DH of the first absorption pattern 132 may be spaced apart from each other at a fourth width W4 in the first direction D1 or in the second direction D2. The fourth width W4 may be in the range of less than about 500 µm. The first absorption pattern 132 may include inner sidewalls 132a exposed through the dummy holes DH. For the first absorption pattern 132, the outer sidewall 132b may be spaced apart at about less than 500 nm from each of the inner sidewalls 132a directly adjacent to the outer sidewall 132b. When hydrogen is piled up between the capping layer 120 and the reflective layer 110 or between the first absorption pattern 132 and the reflective layer 110, the hydrogen may be exhausted from the photomask 10 through the dummy holes DH.

The second absorption pattern 134 may have a fifth width W5 in the first direction D1 and a sixth width W6 in the second direction D2. The fifth width W5 and/or the sixth width W6 may be in the range of less than about 500 µm. When hydrogen enters into the second absorption pattern 134, the hydrogen may be exhausted from the second absorption pattern 134 through the opening 130P therearound. Hydrogen may therefore not be piled up between the capping layer 120 and the reflective layer 110 or between the second absorption pattern 134 and the reflective layer 110. Unlike the first absorption pattern 132, the second absorption pattern 134 may not include dummy holes DH therein. Alternatively, in other embodiments, the second absorption pattern 134 may include dummy holes DH therein.

The first absorption structure 130A may include the third absorption pattern 136 provided on the light shield region 104 of the substrate 100. The third absorption pattern 136 may include dummy holes DH therein. The dummy holes DH included in the third absorption pattern 136 may be substantially the same as those included in the first absorption pattern 132. As viewed in plan, each of the dummy holes DH may have a diameter DM less than a minimum line width determined by a resolution limitation of a lithography apparatus using the photomask 10 according to example embodiments of the inventive concepts. Shapes of the dummy holes DH may thus likely not be transferred onto the wafer. For example, the diameter DM of each of the dummy holes DH may be in the range of about 32 nm or less. The inventive concepts are, however, not limited thereto. The diameter DM of the dummy hole DH may be changed in accordance with a lithography apparatus. For the third absorption pattern 136, a width (not designated by a symbol) between the dummy holes DH directly adjacent to each other may be in the range of less than about 500 µm in the first direction D1 or in the second direction D2. A width (not designated by a symbol) between the opening 130P and its directly adjacent dummy hole DH of the third absorption pattern 136 may be in the range of less than 500 µm. When hydrogen is piled up between the capping layer 120 and the reflective layer 110 or between the third absorption pattern 136 and the reflective layer 110, the hydrogen may be exhausted from the photomask 10 through the dummy holes DH.

During a photolithography process, an impurity (e.g., a carbon-containing impurity) may be formed on a surface of the photomask 10. In order to remove the impurity, hydrogen may be provided onto the photomask 10. The hydrogen may permeate into the photomask 10 to produce a defect where the reflective layer 110 is spaced apart, or delaminated, from the capping layer 120 or from the first absorption structure 130A. In some embodiments, the dummy holes DH may be provided to penetrate the first absorption structure 130A such that the hydrogen may be exhausted from the photomask 10. As a result, it may be possible to eliminate or reduce the defect where the reflective layer 110 is spaced apart, or delaminated, from the capping layer 120 or from the first absorption structure 130A, thereby enhancing durability of the photomask 10.

Figure 3:
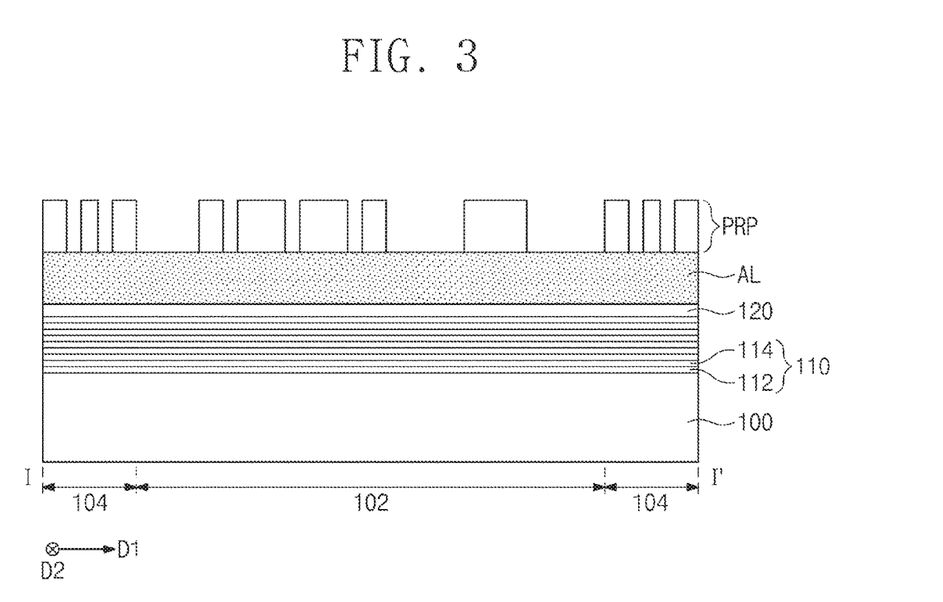
FIG. 3 is a cross-sectional view for explaining a method of fabricating a photomask according to example embodiments of the inventive concepts.

FIG. 3 is a cross-sectional view for explaining a method of fabricating a photomask according to example embodiments of the inventive concepts. For brevity of the description, configurations substantially the same as those discussed with reference to FIGS. 1 and 2 may be omitted.

Referring to FIG. 3, a substrate 100 may be provided. The substrate 100 may include a material having a low thermal expansion coefficient. For example, the substrate 100 may include glass or silicon (Si). The substrate 100 may include a transfer region 102 and a light shield region 104 around the transfer region 102.

A reflective layer 110 may be stacked on the substrate 100. The reflective layer 110 may be formed by alternately stacking low refractive index layers 112 and high refractive index layers 114. For example, the low refractive index layers 112 may include molybdenum (Mo), and the high refractive index layers 114 may include silicon (Si). In some embodiments, each of the low and high refractive index layers 112 and 114 may be repeatedly stacked about 40 to about 60 times.

A capping layer 120 may be formed on the reflective layer 110. In some embodiments, the capping layer 120 may include ruthenium (Ru). The capping layer 120 may be an optional component. For example, in other embodiments, no capping layer 120 may be provided.

An absorption layer AL may be formed on the capping layer 120. The absorption layer AL may include a material that absorbs light (e.g., extreme ultraviolet) irradiated onto the substrate 100. For example, the absorption layer AL may include TaN, TaHf, TaHfN, TaBSi, TaBSiN, TaB, TaBN, TaSi, TaSiN, TaGe, TaGeN, TaZr, TaZrN, or a combination thereof.

A photoresist pattern PRP may be formed on the absorption layer AL. In some embodiments, the photoresist pattern PRP may be formed by depositing a photoresist layer (not shown) on the absorption layer AL and patterning the photoresist layer through an etching process using an etching mask.

Referring back to FIG. 2, a first absorption structure 130A may be formed by patterning the absorption layer AL of FIG. 3 through an etching process using the photoresist pattern PRP of FIG. 3 as an etching mask. When the absorption layer AL of FIG. 3 is patterned, dummy holes DH may be formed simultaneously with the first absorption structure 130A. Thereafter, the photoresist pattern PRP may be removed to provide a photomask 10.

Figure 4:
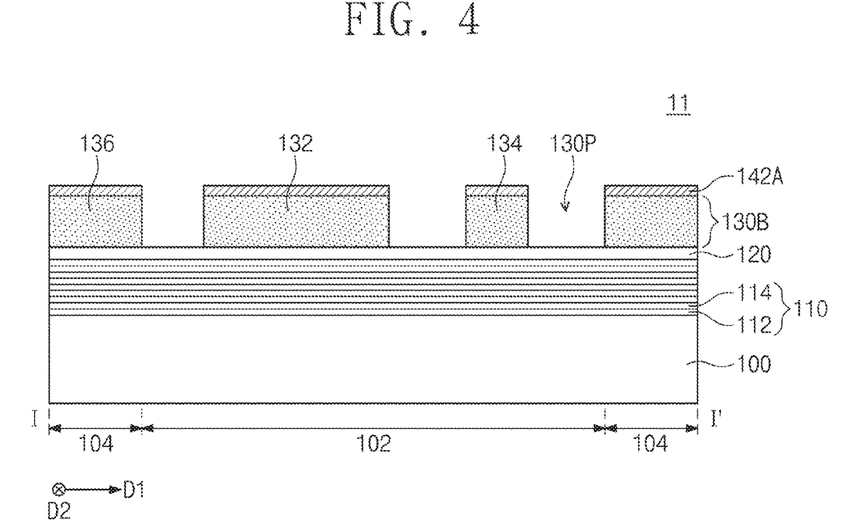
FIG. 4 is a cross-sectional view corresponding to line I-I' of FIG. 1 illustrating a photomask according to example embodiments of the inventive concepts.

FIG. 4 is a cross-sectional view corresponding to line I-I' of FIG. 1 illustrating a photomask according to example embodiments of the inventive concepts. For brevity of the description, configurations substantially the same as those discussed with reference to FIGS. 1 and 2 may be omitted.

Referring to FIG. 4, a photomask 11 may be provided to include a substrate 100, a reflective layer 110, and a capping layer 120 that are sequentially stacked. The substrate 100, the reflective layer 110, and the capping layer 120 may be substantially the same as those discussed with reference to FIGS. 1 and 2. A second absorption structure 130B may be provided on the capping layer 120. The second absorption structure 130B may be substantially the same as the first absorption structure 130A illustrated in FIGS. 1 and 2, except the second absorption structure 130B may not include the dummy holes DH therein. For example, identically or similarly to that illustrated in FIG. 2, the second absorption structure 130B may include first to third absorption patterns 132, 134, and 136 on the capping layer 120 and an opening 130P through which the capping layer 120 is exposed between the first to third absorption patterns 132, 134, and 136.

A first barrier pattern 142A may be provided on the second absorption structure 130B. The first barrier pattern 142A may be provided on top surfaces of the first to third absorption patterns 132, 134, and 136 of the second absorption structure 130B. The first barrier pattern 142A may include a material that reduces the amount of hydrogen passing through in comparison with the second absorption structure 130B and the capping layer 120. For example, the first barrier pattern 142A may include nitride (e.g., Si3N4, TiN, BN), carbide (e.g., SiC, B4C), oxide (e.g., Ta2O5, Nb2O5, Y2O3, Al2O3), metal (e.g., molybdenum (Mo), tungsten (W), Mo2C), or a combination thereof. Films including the above material have reduced permeability in comparison with the absorption structure for temperatures close to room temperature.

The first barrier pattern 142A may block or reduce permeation of hydrogen into the second absorption structure 130B, so that hydrogen may be prevented from being piled up between the capping layer 120 and the reflective layer 110 or between the second absorption structure 130B and the reflective layer 110. As a result, it may be possible to eliminate or reduce the defect where the reflective layer 110 is spaced apart, or delaminated, from the capping layer 120 or from the second absorption structure 130B, thereby enhancing durability of the photomask 11.

A method of fabricating the photomask 11 of FIG. 4 will be described below with reference back to FIG. 3. Likewise the method of fabricating the photomask 10 discussed with reference to FIG. 3, a substrate 100, a reflective layer 110, a capping layer 120, and an absorption layer AL may be sequentially stacked. A barrier layer (not shown) may be stacked on the absorption layer AL. The barrier layer may include a material that reduces the amount of hydrogen passing through in comparison with the absorption layer AL and the capping layer 120. For example, the barrier layer may include nitride (e.g., Si3N4, TiN, BN), carbide (e.g., SiC, B4C), oxide (e.g., Ta2O5, Nb2O5, Y2O3, Al2O3), metal (e.g., molybdenum (Mo), tungsten (W), Mo2C), or a combination thereof. The barrier layer and the absorption layer AL may be sequentially patterned through an etching process using a photoresist pattern, and thus as shown in FIG. 4, a second absorption structure 130B and a first barrier pattern 142 thereon may be formed. The photoresist pattern may be substantially the same as the photoresist pattern PRP discussed with reference to FIG. 3, except the photoresist pattern does not include openings for forming the dummy holes DH. Thereafter, the photoresist pattern may be removed to provide a photomask 11.

Figure 5:
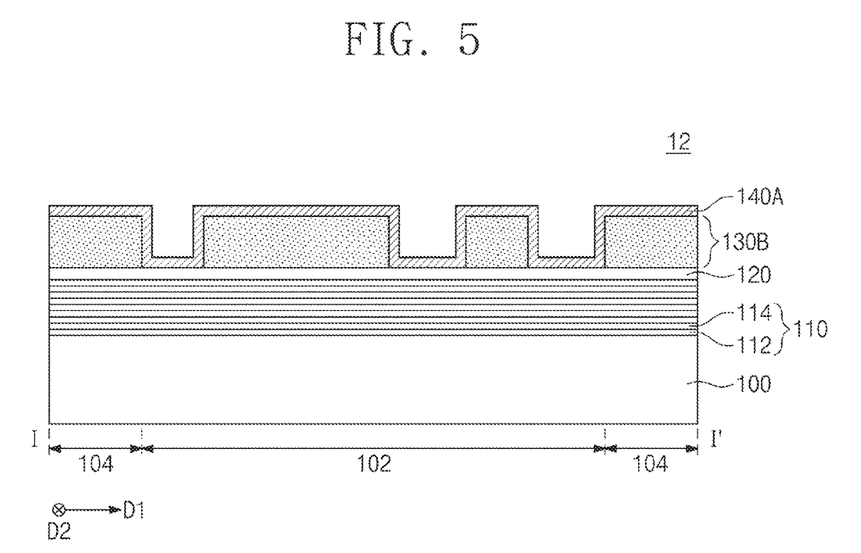
FIG. 5 is a cross-sectional view corresponding to line I-I' of FIG. 1 illustrating a photomask according to example embodiments of the inventive concepts.

FIG. 5 is a cross-sectional view corresponding to line I-I' of FIG. 1 illustrating a photomask according to example embodiments of the inventive concepts. For brevity of the description, configurations substantially the same as those discussed with reference to FIGS. 1 and 2 may be omitted.

Referring to FIG. 5, a photomask 12 may be provided to include a substrate 100, a reflective layer 110, a capping layer 120, and a second absorption structure 130B that are sequentially stacked. The substrate 100, the reflective layer 110, the capping layer 120, and the second absorption structure 130B may be substantially the same as those discussed with reference to FIG. 4.

A first barrier layer 140A may be provided on the second absorption structure 130B and the capping layer 120. For example, the first barrier pattern 140A may be provided on top surfaces of the first to third absorption patterns 132, 134, and 136 of the second absorption structure 130B. For example, the first barrier layer 140A may have a shape conformal to morphology on the substrate 100. The first barrier layer 140A may include a material that reduces the amount of hydrogen passing through in comparison with the second absorption structure 130B and the capping layer 120. For example, the first barrier layer 140A may include substantially the same material as the first barrier pattern 142A discussed with reference to FIG. 4.

The first barrier layer 140A may block or reduce permeation of hydrogen into the second absorption structure 130B, so that the hydrogen may be reduced from being piled up between the capping layer 120 and the reflective layer 110 or between the second absorption structure 130B and the reflective layer 110. As a result, it may be possible to eliminate or reduce the defect where the reflective layer 110 is spaced apart, or delaminated, from the capping layer 120 or from the second absorption structure 130B, thereby enhancing durability of the photomask 12.

A method of fabricating the photomask 12 of FIG. 5 will be described below with reference back to FIG. 3. Likewise the method of fabricating the photomask 11 of FIG. 4 discussed with reference back to FIG. 3, a substrate 100, a reflective layer 110, and a capping layer 120 may be sequentially stacked. A second absorption structure 130B may be provided on the capping layer 120. The second absorption structure 130B may be formed by forming an absorption layer (not shown) on the capping layer 120 and patterning the absorption layer through an etching process using a photoresist pattern (not shown) as an etching mask. The photoresist pattern may be substantially the same as the photoresist pattern PRP discussed with reference to FIG. 3, except the photoresist pattern includes no openings for forming the dummy holes DH. The photoresist pattern may be removed after the second absorption structure 130B is formed.

A first barrier layer 140A may be provided on the second absorption structure 130B and the capping layer 120, thereby fabricating a photomask 12. The first barrier layer 140A may cover a top surface and a sidewall of the second absorption structure 130B, and may also cover a top surface of the capping layer 120 exposed through the second absorption structure 130B. For example, the first barrier layer 140A may be a layer conformal to morphology on the substrate 100. The first barrier layer 140A may include a material that reduces the amount of hydrogen passing through in comparison with the second absorption structure 130B and the capping layer 120. For example, the first barrier layer 140A may include substantially the same material as the first barrier pattern 142A discussed with reference to FIG. 4.

Figure 6:
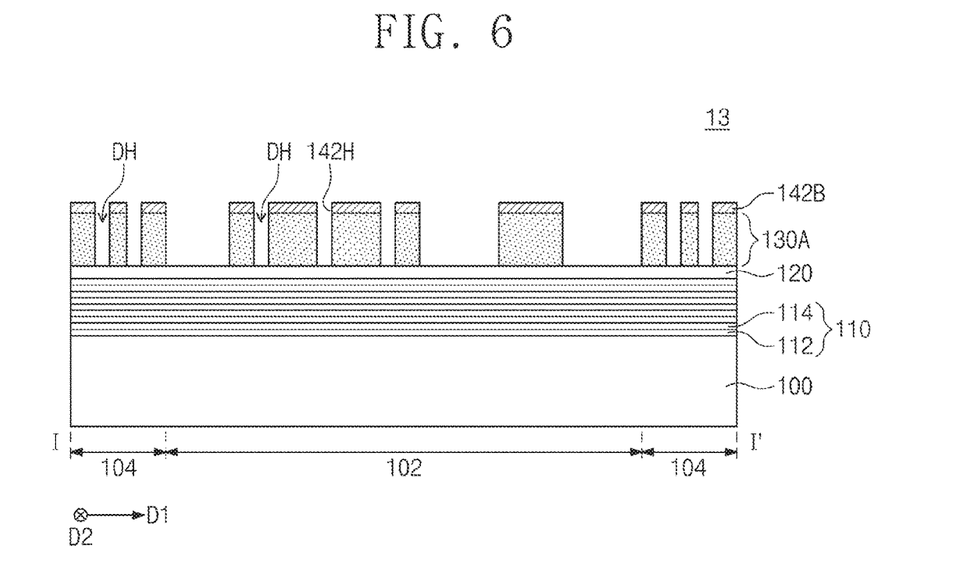
FIG. 6 is a cross-sectional view corresponding to line I-I' of FIG. 1 illustrating a photomask according to example embodiments of the inventive concepts.

FIG. 6 is a cross-sectional view corresponding to line I-I' of FIG. 1 illustrating a photomask according to example embodiments of the inventive concepts. For brevity of the description, configurations substantially the same as those discussed with reference to FIGS. 1 and 2 may be omitted.

Referring to FIG. 6, a photomask 13 may be provided to include a substrate 100, a reflective layer 110, a capping layer 120, and a first absorption structure 130A that are sequentially stacked. The substrate 100, the reflective layer 110, the capping layer 120, and the first absorption structure 130A may be substantially the same as those discussed with reference to FIGS. 1 and 2.

A second barrier pattern 142B may be provided on the first absorption structure 130A. The second barrier pattern 142B may include a material that reduces the amount of hydrogen passing through in comparison with the first absorption structure 130A and the capping layer 120. For example, the second barrier pattern 142B may include substantially the same material as the first barrier pattern 142A discussed with reference to FIG. 4. The second barrier pattern 142B may be provided on top surfaces of the first to third absorption patterns 132, 134, and 136 of the first absorption structure 130A. The second barrier pattern 142B may include barrier holes 142H penetrating therethrough, and each of the barrier holes 142H may be spatially connected to one of the dummy holes DH in the absorption patterns 132, 134, and 136.

The second barrier pattern 142B may block or reduce permeation of hydrogen into the photomask 13. When hydrogen enters into the photomask 13, the hydrogen may be exhausted from the photomask 13 through the dummy holes DH. As a result, it may be possible to eliminate or reduce the defect where the reflective layer 110 is spaced apart, or delaminated, from the capping layer 120 or from the first absorption structure 130A, thereby enhancing durability of the photomask 13.

A method of fabricating the photomask 13 of FIG. 6 will be exemplarily described below with reference back to FIG. 3. The method of fabricating the photomask 13 according to example embodiments of the inventive concepts may be substantially the same as that discussed with reference to FIG. 3, except that a barrier layer (not shown) is provided between the absorption layer AL and the photoresist pattern PRP. The barrier layer may include a material that reduces the amount of hydrogen passing through in comparison with the first absorption structure 130A and the capping layer 120. For example, the barrier layer may include substantially the same material as the first barrier pattern 142A discussed with reference to FIG. 4. The barrier layer and the absorption layer AL may be patterned through an etching process using the photoresist pattern PRP as an etching mask. The patterning of the barrier layer and the absorption layer AL may form a first absorption structure 130A and a second barrier pattern 142B on the first absorption structure 130A. The photoresist pattern PRP may be removed to provide a photomask 13.

Figure 7:
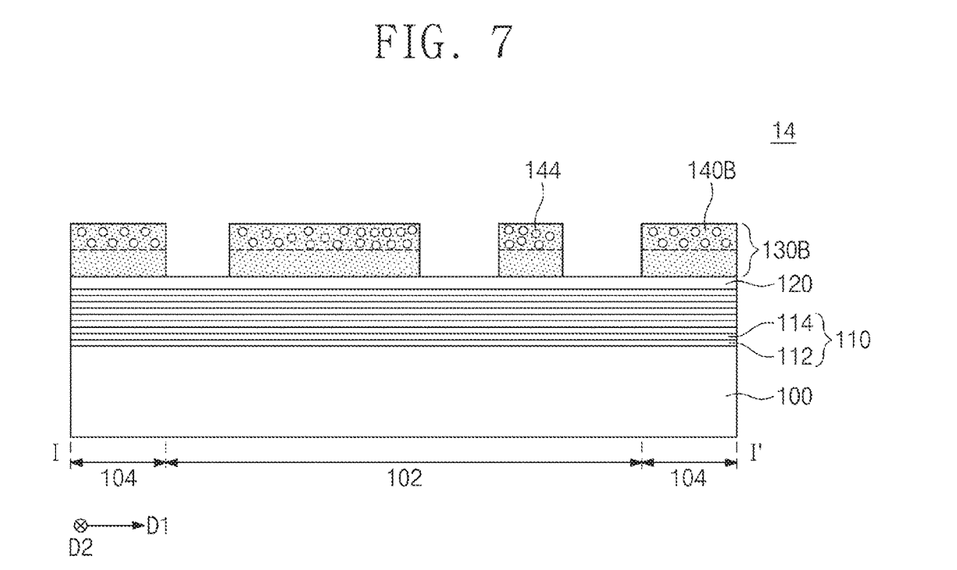
FIG. 7 is a cross-sectional view corresponding to line I-I' of FIG. 1 illustrating a photomask according to example embodiments of the inventive concepts.

FIG. 7 is a cross-sectional view corresponding to line I-I' of FIG. 1 illustrating a photomask according to example embodiments of the inventive concepts. For brevity of the description, configurations substantially the same as those discussed with reference to FIGS. 1 and 2 may be omitted.

Referring to FIG. 7, a photomask 14 may be provided to include a substrate 100, a reflective layer 110, a capping layer 120, and a second absorption structure 130B that are sequentially stacked. The substrate 100, the reflective layer 110, the capping layer 120, and the second absorption structure 130B may be substantially the same as those discussed with reference to FIG. 4, except that a second barrier layer 140B is provided in the second absorption structure 130B.

Dopants 144 may be doped into an upper portion of each of the first to third absorption patterns 132, 134, and 136, so that the second barrier layer 140B may be provided. The second barrier layer 140B may include the same material as the second absorption structure 130B, and also include the dopants 144 doped into the material thereof. In other example embodiments, a single unitary structure (not shown) may be provided to include the second absorption structure 130B and the second barrier layer 140B that have the same material and the same dopant. For example, the second absorption structure 130B may be doped with the dopants 144 from a bottom surface to a top surface thereof. The dopant 144 may include a material that reduces the amount of hydrogen passing through in comparison with the second absorption structure 130B and the capping layer 120. For example, the dopant 144 may include nitride (e.g., Si3N4, TiN, BN), carbide (e.g., SiC, B4C), oxide (e.g., Ta2O5, Nb2O5, Y2O3, Al2O3), metal (e.g., molybdenum (Mo), tungsten (W), Mo2C), or a combination thereof.

The second barrier layer 140B may block or reduce permeation of hydrogen into the photomask 14, so that the hydrogen may be reduce from being piled up between the capping layer 120 and the reflective layer 110 or between the second absorption structure 130B and the reflective layer 110. As a result, it may be possible to eliminate or reduce the defect where the reflective layer 110 is spaced apart, or delaminated, from the capping layer 120 or from the second absorption structure 130B, thereby enhancing durability of the photomask 14.

A method of fabricating the photomask 14 of FIG. 7 will be exemplarily described below with reference back to FIG. 3. The method of fabricating the photomask 14 according to example embodiments of the inventive concepts may be substantially the same as the method of fabricating the photomask 11 of FIG. 4 discussed with reference back to FIG. 3. Likewise the method of fabricating the photomask 11 discussed with reference to FIG. 3, a substrate 100, a reflective layer 110, a capping layer 120, and an absorption layer AL may be sequentially stacked. The absorption layer AL may be doped with the dopants 144 discussed with reference to FIG. 7. The dopant 144 may include a material that reduces the amount of hydrogen passing through in comparison with the second absorption structure 130B and the capping layer 120. For example, the dopant 144 may include nitride (e.g., Si3N4, TiN, BN), carbide (e.g., SiC, B4C), oxide (e.g., Ta2O5, Nb2O5, Y2O3, Al2O3), metal (e.g., molybdenum (Mo), tungsten (W), Mo2C), or a combination thereof.

A photoresist pattern may be formed on the absorption layer AL. Unlike that shown in FIG. 3, the photoresist pattern may include no pattern for forming the dummy holes DH. A second absorption structure 130B may be formed by patterning the absorption layer AL through an etching process using the photoresist pattern as an etching mask. Thereafter, the photoresist pattern may be removed to provide a photomask 14.

Figure 8:
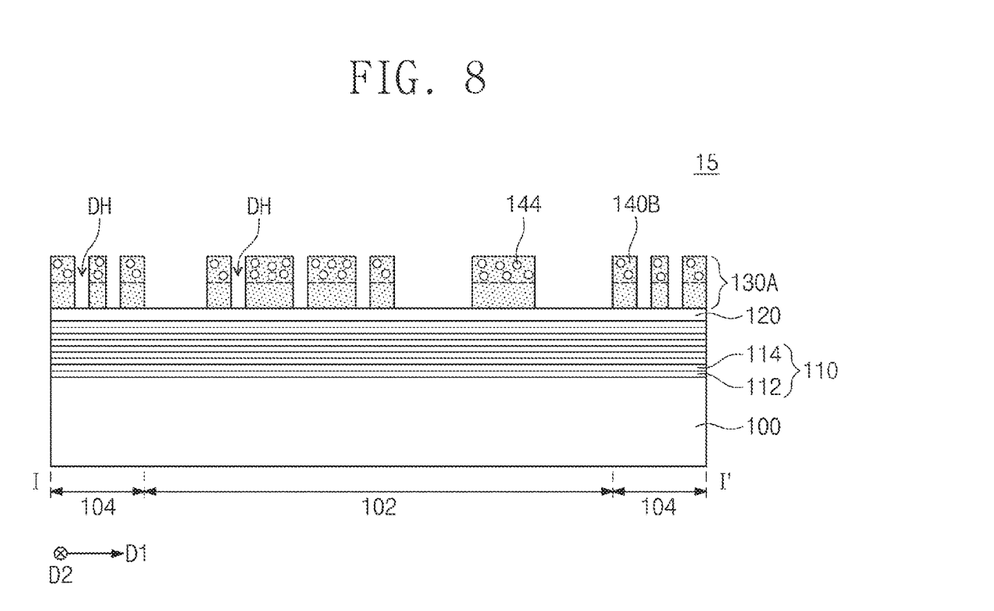
FIG. 8 is a cross-sectional view corresponding to line I-I' of FIG. 1 illustrating a photomask according to example embodiments of the inventive concepts.

FIG. 8 is a cross-sectional view corresponding to line I-I' of FIG. 1 illustrating a photomask according to example embodiments of the inventive concepts. For brevity of the description, configurations substantially the same as those discussed with reference to FIGS. 1 and 2 may be omitted.

Referring to FIG. 8, a photomask 15 may be provided to include a substrate 100, a reflective layer 110, a capping layer 120, and a first absorption structure 130A that are sequentially stacked. The substrate 100, the reflective layer 110, the capping layer 120, and the first absorption structure 130A may be substantially the same as those discussed with reference to FIGS. 1 and 2, except that a second barrier layer 140B is provided in the first absorption structure 130A.

Dopants 144 may be doped into an upper portion of each of the first to third absorption patterns 132, 134, and 136, and thereby the second barrier layer 140B may be provided. The second barrier layer 140B may include the same material as the first absorption structure 130A, and also include the dopants 144 doped into the material thereof. In other example embodiments, a single unitary structure (not shown) may be provided to include the first absorption structure 130A and the second barrier layer 140B that have the same material and the same dopant. For example, the first absorption structure 130A may be doped with the dopants 144 from a bottom surface to a top surface thereof. The dopant 144 may include a material that reduces the amount of hydrogen passing through in comparison with the first absorption structure 130A and the capping layer 120. For example, the dopant 144 may include substantially the same material as the dopant 144 discussed with reference to FIG. 7.

The second barrier layer 140B may block or reduce permeation of hydrogen into the photomask 15. When hydrogen enters into the photomask 15, the hydrogen may be exhausted from the photomask 15 through the dummy holes DH. As a result, the hydrogen may be prevented from being piled up between the capping layer 120 and the reflective layer 110 or between the first absorption structure 130A and the reflective layer 110, and it therefore may be possible to eliminate or reduce the defect where the reflective layer 110 is spaced apart, or delaminated, from the capping layer 120 or from the first absorption structure 130A. In other words, the photomask 15 may be provided to have enhanced durability.

A method of fabricating the photomask 15 of FIG. 8 will be exemplarily described below with reference back to FIG. 3. The method of fabricating the photomask 15 according to example embodiments of the inventive concepts may be substantially the same as that discussed with reference to FIG. 3, except that the absorption layer AL is doped with the dopants 144. The dopant 144 may include a material that reduces the amount of hydrogen passing through in comparison with the first absorption structure 130A and the capping layer 120. For example, the dopant 144 may include substantially the same material as the dopant 144 discussed with reference to FIG. 7.

The photomask may be used under a hydrogen gas atmosphere. Hydrogen may permeate into the absorption structure and thus be piled up between the capping layer and the reflective layer of the photomask. The photomask may be impaired by the hydrogen between the capping layer and the reflective layer. According to example embodiments of the inventive concepts, the absorption structure may have the dummy holes therein. Hydrogen entered into the absorption structure may be exhausted from the photomask through the dummy holes. According to example embodiments of the inventive concepts, the absorption structure may be provided thereon with the barrier pattern or the barrier layer. The barrier pattern or the barrier layer may prevent hydrogen from entering into the absorption structure.

Figure 9:
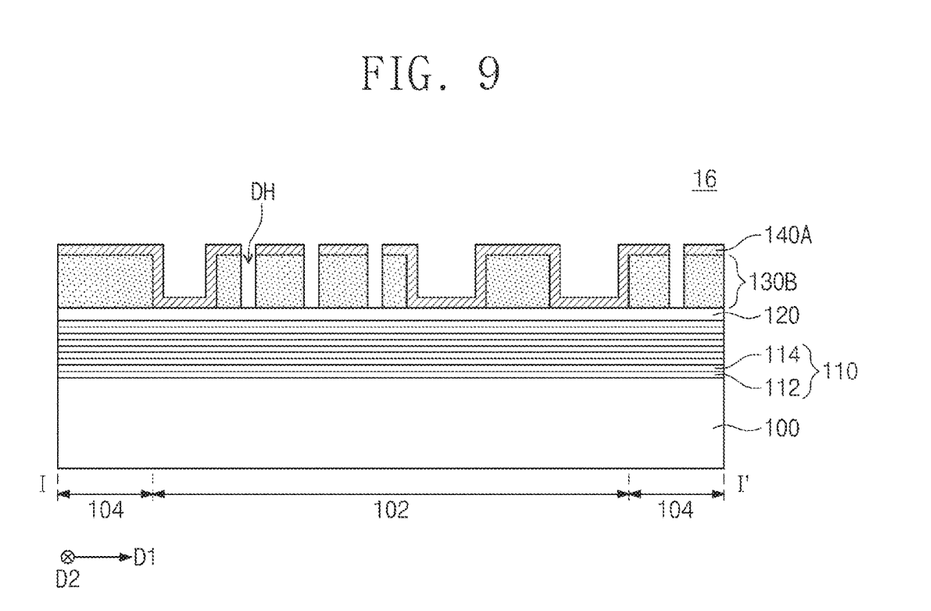
FIG. 9 is a cross-sectional view corresponding to line I-I' of FIG. 1 illustrating a photomask according to example embodiments of the inventive concepts.

FIG. 9 is a cross-sectional view corresponding to line I-I' of FIG. 1 illustrating a photomask according to example embodiments of the inventive concepts. For brevity of the description, configurations substantially the same as those discussed with reference to FIGS. 5 and 6 may be omitted.

A method of fabricating a photomask 16 of FIG. 9 may proceed similar to the method of fabricating the photomask 12 of FIG. 5. Additionally, a second photoresist pattern PRP' may be formed on the barrier layer 140A. The second photoresist pattern PRP' may include openings for dummy holes DH, The dummy holes DH may be formed by patterning the barrier layer 140A and the absorption structure 130B of FIG. 9 through an etching process using the photoresist pattern PRP' as an etching mask.

However, the effect of the inventive concepts is not limited to the mentioned above.

The aforementioned description provides example embodiments for explaining the inventive concepts. Therefore, the inventive concepts are not limited to the embodiments described above, and it will be understood by one of ordinary skill in the art that variations in form and detail may be made therein without departing from the spirit and essential features of the inventive concepts.

What is claimed is:

1. A photomask comprising:
   a substrate including a transfer region and a light shield region surrounding the transfer region, the light shield region configured to block transfer of light from the photomask;
   a reflective layer on the substrate;
   an absorption structure on the reflective layer; and
   a barrier layer over both the transfer region and the light shield region, the absorption structure including,
      a plurality of absorption patterns spaced apart from one another on the reflective layer, and
      a plurality of dummy holes in at least one of the plurality of absorption patterns and extending from a top surface of the barrier layer through the absorption structure, wherein
   the barrier layer conformally covers a top surface of and sides of the plurality of the absorption patterns except where the dummy holes are provided,
   at least one of the plurality of dummy holes is in at least the light shield region,
   and
   at least one of the plurality of dummy holes over the light shield region has a diameter less than a line width determined by a resolution limit of a lithography apparatus using the photomask.

2. The photomask of claim 1, wherein, in at least one of the plurality of absorption patterns, at least two of the plurality of dummy holes are spaced apart at a width of less than 500 μm in a first direction parallel to a top surface of the substrate.

3. The photomask of claim 1, wherein at least one of the plurality of absorption patterns is provided on the transfer region, the at least one of the plurality of absorption patterns including some of the plurality of dummy holes.

4. The photomask of claim 1, wherein at least one of the plurality of absorption patterns includes an outer sidewall and an inner sidewall exposed through at least one of the plurality of dummy holes adjacent to the outer sidewall, the inner sidewall being spaced apart at a distance of less than 500 μm from the outer sidewall.

5. The photomask of claim 1, wherein
   the barrier layer includes the same material as the absorption structure, and includes a dopant doped into the material thereof.

6. The photomask of claim 5, wherein, in the at least one of the plurality of absorption patterns, adjacent ones of dummy holes are spaced apart at a width of less than 500 μm in a first direction or in a second direction that is parallel to a top surface of the substrate while crossing the first direction.

7. The photomask of claim 5, wherein the absorption structure and the barrier layer including the same material and the same dopant constitute a single layer.

8. The photomask of claim 1, further comprising:
   a capping layer between the reflective layer and the absorption structure, wherein
   the at least one of the plurality of dummy holes over the light shield region exposes a top surface of the capping layer.

9. The photomask of claim 1, wherein at least one of the plurality of dummy holes is configured to exhaust hydrogen from the absorption pattern.

* * * * *